(12) United States Patent
Lim et al.

(10) Patent No.: US 8,735,967 B2
(45) Date of Patent: May 27, 2014

(54) SEMICONDUCTOR MEMORY DEVICE AND METHOD OF MANUFACTURING THE SAME

(75) Inventors: Se Yun Lim, Seoul (KR); Eun Seok Choi, Seongnam-si (KR)

(73) Assignee: SK Hynix Inc., Gyeonggi-do (KR)

( * ) Notice: Subject to any disclaimer, the term of this patent is extended or adjusted under 35 U.S.C. 154(b) by 30 days.

(21) Appl. No.: 13/397,248

(22) Filed: Feb. 15, 2012

(65) Prior Publication Data
US 2012/0211823 A1 Aug. 23, 2012

(30) Foreign Application Priority Data

Feb. 17, 2011 (KR) .......................... 10-2011-0014212

(51) Int. Cl.
*H01L 21/8239* (2006.01)
(52) U.S. Cl.
USPC .......................................... 257/326; 438/206
(58) Field of Classification Search
USPC ....................................................... 257/326
See application file for complete search history.

(56) References Cited

U.S. PATENT DOCUMENTS

| | | | |
|---|---|---|---|
| 7,646,054 B2 * | 1/2010 | Mokhlesi | 257/315 |
| 8,331,149 B2 * | 12/2012 | Choi et al. | 365/185.05 |
| 2008/0067572 A1 * | 3/2008 | Mokhlesi | 257/315 |
| 2011/0062510 A1 * | 3/2011 | Joo | 257/324 |
| 2011/0090737 A1 * | 4/2011 | Yoo et al. | 365/185.11 |

FOREIGN PATENT DOCUMENTS

| | | |
|---|---|---|
| KR | 10-2010-0066783 A | 6/2010 |
| KR | 1020100133671 A | 12/2010 |
| KR | 1020110013773 A | 2/2011 |

* cited by examiner

*Primary Examiner* — Thao P Le
(74) *Attorney, Agent, or Firm* — William Park & Associates Patent Ltd.

(57) ABSTRACT

A semiconductor memory device includes a lower select transistor formed within a semiconductor substrate, memory cells stacked over the lower select transistors, and an upper select transistor formed over the memory cells.

26 Claims, 13 Drawing Sheets

SEMICONDUCTOR MEMORY DEVICE AND METHOD OF MANUFACTURING THE SAME

CROSS-REFERENCE TO RELATED APPLICATION

Priority is claimed to Korean patent application number 10-2011-0014212 filed on Feb. 17, 2011, the entire disclosure of which is incorporated herein by reference in its entirety.

BACKGROUND

Exemplary embodiments of the present invention relate generally to a semiconductor memory device and a method of manufacturing the same and, more particularly, to a semiconductor memory device including vertical channel layers and an operating method thereof.

Number of memory cells in a limited chip area can be increased by configuring a semiconductor memory device to include a three dimensional (3-D) structured memory array in which the memory cells are vertically stacked. In the 3-D structured memory array, channel layers of the memory cells are formed in a direction vertical to a semiconductor substrate, and word lines surrounding the vertical channel layers at specific intervals are formed in a cell region.

However, in a peripheral region, components of the semiconductor device, such as transistors, are formed to have a common 2-D structure. After the memory cells in the cell region are formed, the transistors in the peripheral region are formed.

Since the memory cells are vertically stacked in the cell region, a difference of thickness between the cell region and the peripheral region may increase, and forming the transistors in the peripheral region may become more complex.

BRIEF SUMMARY

According to an exemplary embodiment, a difference of thickness between a cell region and a peripheral region can be reduced by forming underlying structures of a memory array within a semiconductor substrate. Transistors can be easily formed in the peripheral region, the number of process steps can be reduced, and manufacturing processes can be simplified by performing processes of forming the memory array in the cell region and processes of forming the transistors in the peripheral region at the same time.

A semiconductor memory device according to an aspect of the present disclosure includes lower select transistors formed within a semiconductor substrate, memory cells stacked over each of the lower select transistors, and an upper select transistor placed at the highest of the memory cells.

The semiconductor memory device further includes a common source formed within the semiconductor substrate to surround the lower select transistor. The lower select gate of the lower select transistor may be placed within each of trenches formed in the common source. Part of the common source defined by the trench becomes a channel region of the lower select transistor. The common source may be formed of an N type impurity region.

The semiconductor memory device further includes an insulating layer placed between the lower select gate and the common source, wherein the thickness of the insulating layer may be thicker in the bottom of the trench than in the sidewall of the trench.

The stacked memory cells include word lines stacked over the semiconductor substrate including the lower select transistor, a vertical channel layer coupled to the channel region of the lower select transistor through the word lines, and a charge trap stack layer formed between the vertical channel layer and the word lines.

The lower select gate of the lower select transistor may be protruded higher than the semiconductor substrate. In this case, the charge trap stack layer may be extended between the lower select gates and the vertical channel layer.

The channel region of the lower select transistor, the vertical channel layer of the stacked memory cells, and the channel layer of the upper select transistor are vertically coupled.

A semiconductor memory device according to another aspect of this disclosure includes protrusions defined by trenches each formed in the impurity region of a semiconductor substrate lengthwise and crosswise, a first conductive layer formed within the trench, a stack structure in which a second insulating layer and a second conductive layer are alternately stacked over the first conductive layer and the impurity region, third conductive layers arranged on the stack structure in parallel in a first direction, and vertical conductive layers coupled to the respective protrusions of the impurity region through the stack structure and the third conductive layers.

The depth of the impurity region may be deeper than the depth of the trench.

The trenches include first trenches formed in the impurity region in parallel lengthwise and second trenches formed in the impurity region in parallel crosswise and formed to cross the first trenches.

The semiconductor memory device further includes a first insulating layer placed between the first conductive layer and the impurity region and a third insulating layer placed between the second conductive layers and the vertical conductive layers.

The semiconductor memory device further includes a charge trap layer placed between the second conductive layers and the vertical conductive layers.

The semiconductor memory device may further include a first isolation insulating layer placed between the second conductive layers and the charge trap layer and a second isolation insulating layer placed between the charge trap layer and the vertical conductive layers.

The first conductive layer may be formed on the protrusions of the impurity region, and the vertical conductive layers may be coupled to the respective protrusions through the first conductive layer.

The semiconductor memory device may further include a charge trap layer placed between the first conductive layer and the vertical conductive layers and between the second conductive layers and the vertical conductive layers.

In the stack structure, the second insulating layer may be placed in the highest layer and the lowest layer.

The semiconductor memory device may further include first wire structures arranged in parallel in a first direction and respectively coupled to the second conductive layers of the stack structure, second wire structures arranged in parallel to the first wire structures and coupled to the impurity region, third wire structures arranged in parallel in the first direction and respectively coupled to the third conductive layers, and fourth wire structures arranged in parallel in a second direction crossing the first direction and coupled to the respective vertical conductive layers.

The fourth wire structures may be placed between the first wire structures and the second wire structures.

The vertical conductive layers penetrating the same third conductive layer may be coupled to the different fourth wire structures. The vertical conductive layers penetrating the different third conductive layers may be coupled to the same fourth wire structure.

A semiconductor memory device according to yet another aspect of this disclosure includes a common source formed within a semiconductor substrate and formed to include trenches formed near a channel connection region, low select gates each formed within each of the trenches of the common source, insulating layers and word lines alternately stacked over the common source and the lower select gate, upper select gates each placed at a highest insulating layer of the insulating layers, vertical channel layers each coupled to the channel connection region of the common source through the upper select gates, the insulating layers, and the word lines, and a charge trap layer formed between the word lines and the vertical channel layer.

The depth of the common source may be deeper than the depth of the trench.

The semiconductor memory device may further include local word line wires coupled to the respective word lines, an upper select line coupled to the upper select gate, a bit line coupled to the vertical channel layer, and a common source line coupled to the common source.

A method of manufacturing a semiconductor memory device according to an aspect of this disclosure includes forming an impurity region within a semiconductor substrate, forming trenches to define concave parts and convex parts within the impurity region, forming a first insulating layer on the entire surface of the impurity region including the trenches, forming a first conductive layer in the impurity region to fill the trenches, forming a stack structure in which a second insulating layer and a second conductive layer are alternately stacked on the impurity region including the first conductive layer, forming a charge trap layer and a first vertical conductive layer within each of holes through which the convex parts of the impurity region are exposed through the stack structure, forming third conductive layers arranged in parallel on underlying structures including the vertical conductive layers, and forming a third insulating layer and a second vertical conductive layer within each of holes through which the vertical conductive layer is exposed through the third conductive layers.

The impurity region may be formed by implanting N type impurities into the semiconductor substrate.

The trenches may have a shallow depth than the impurity region.

The trenches may be formed so that the convex parts of the impurity region are regularly arranged lengthwise and crosswise.

Trenches for isolation are formed in a peripheral region when the trenches are formed to define the concave parts and the convex parts within the impurity region. An insulating layer for isolation may be formed in the trenches of the peripheral region, after forming the trenches for isolation. When the insulating layer for isolation is formed in the trenches of the peripheral region, an insulating layer for isolation may be formed in the trenches of the impurity region and an etch process may be further performed so that the insulating layer for isolation remains only at the bottom of the trenches of the impurity region.

When the first conductive layer is formed, a conductive layer for gates of transistors may be formed in a peripheral region.

The first conductive layer may be formed in the convex parts of the impurity region, and the holes penetrating the stack structure may be formed to penetrate the first conductive layer formed on the convex parts.

A process of forming transistors in the peripheral region may be performed, before forming the stack structure.

In the stack structure, the second insulating layer may include the highest layer and the lowest layer.

Before forming the third conductive layers, the stack structure may be etched so that the ends of second conductive layers of the stack structure are patterned stepwise.

A first isolation insulating layer may be further formed between the stack structure and the charge trap layers, and a second isolation insulating layer may be further formed between the charge trap layers and the first the vertical conductive layers.

The method may further include forming first wire structures respectively coupled the second conductive layers of the stack structure, second wire structures coupled to the impurity region, third wire structures respectively coupled to the third conductive layers, and fourth wire structures coupled to the second vertical conductive layers.

The second vertical conductive layers penetrating the same third conductive layer may be coupled to the different fourth wire structures, and the second vertical conductive layers penetrating the different third conductive layers may be coupled to the same fourth wire structure.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1:
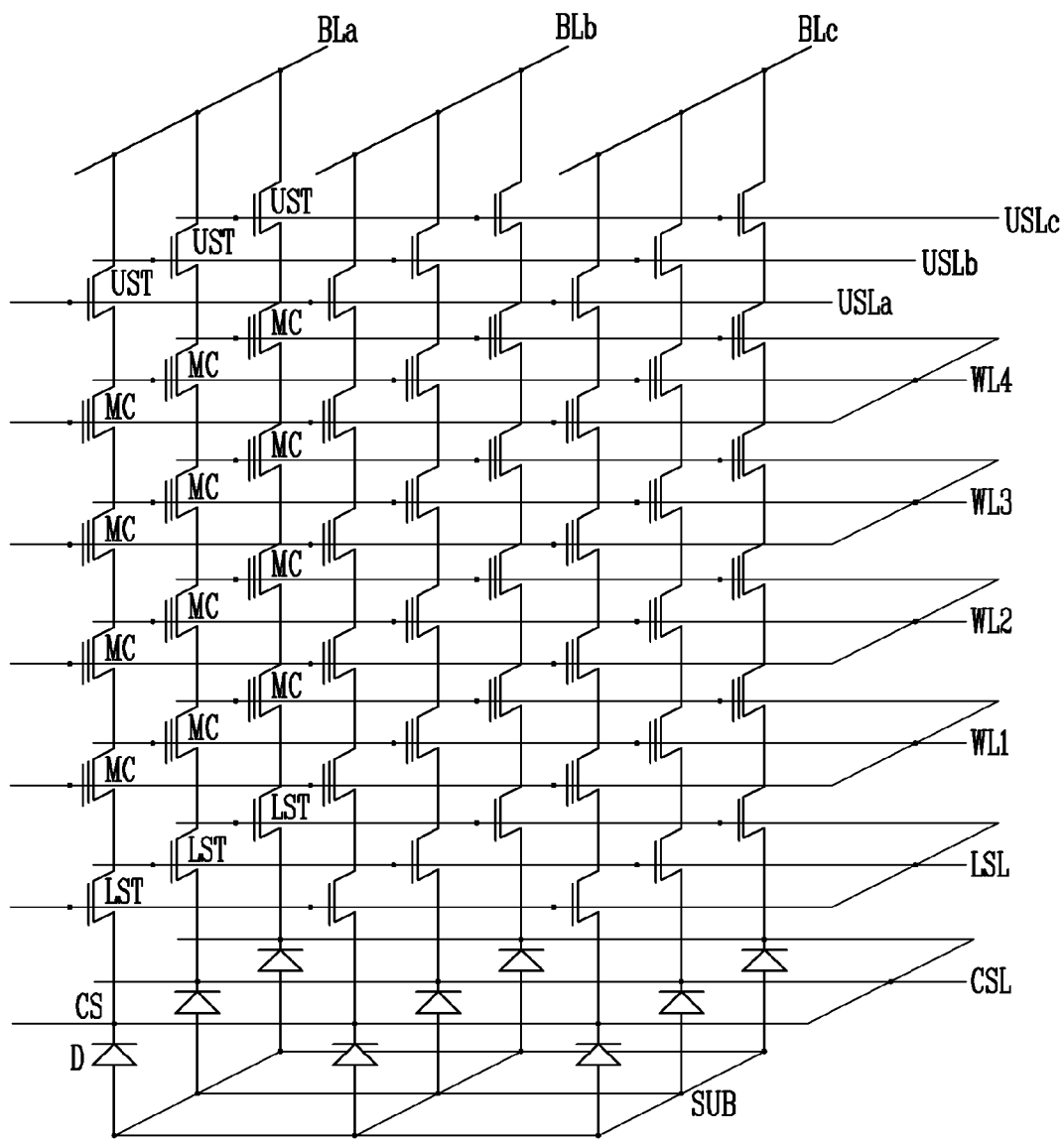
FIG. 1 is an equivalent circuit diagram of a flash memory array having a bit-cost scalable (BiCS) structure included in a semiconductor memory device according to an embodiment of the present invention.

FIG. 1 is an equivalent circuit diagram of a flash memory array having a bit-cost scalable (BiCS) structure included in a semiconductor memory device according to an embodiment of the present invention.

Referring to FIG. 1, the memory array having the BiCS structure includes a plurality of memory blocks. Each of the memory blocks includes a plurality of memory strings vertically coupled between a substrate SUB and bit lines BLa, BLb, and BLc. An example where three memory strings are coupled to the respective bit lines is illustrated, for the convenience of description. However, the number of bit lines and the number of memory strings coupled to the bit lines may vary according to a design.

Each of the memory strings includes an upper select transistors UST having a drain coupled to the bit line, a lower select transistors LST having a source coupled to a common source CS, and a plurality of memory cells MC coupled in series between the select transistors UST and LST and vertically stacked. The substrate SUB is a P type substrate, and the common source CS is made of N type polysilicon. Thus, the substrate SUB and the common source CS form a diode D of a PN junction. In addition, the sources of the lower select transistors LST of all the memory strings are coupled to the common source CS, and the common source CS is coupled to the common source line CSL through a wire process.

In a memory block, the gates of the lower select transistors LST are coupled to form a lower select line LSL, and the control gates of the memory cells MC formed in the same layer are coupled to form a word line WL. Furthermore, the gates of the upper select transistors UST coupled to the different bit lines BLa, BLb, and BLc are coupled to form upper select lines USLa, USLb, and USLc.

In addition, a plurality of the memory strings is coupled in parallel between a bit line (for example, BLa) and the common source CS. In order to select the memory strings coupled in parallel and perform an operation independently, the gates of the upper select transistors UST coupled to the same bit line (for example, BLa) are separated from each other.

In order for the memory string to be vertically coupled between the bit line (for example, BLa) and the common source CS, the memory cells are vertically stacked using a vertical channel layer. This is described in detail below.

Figure 2:
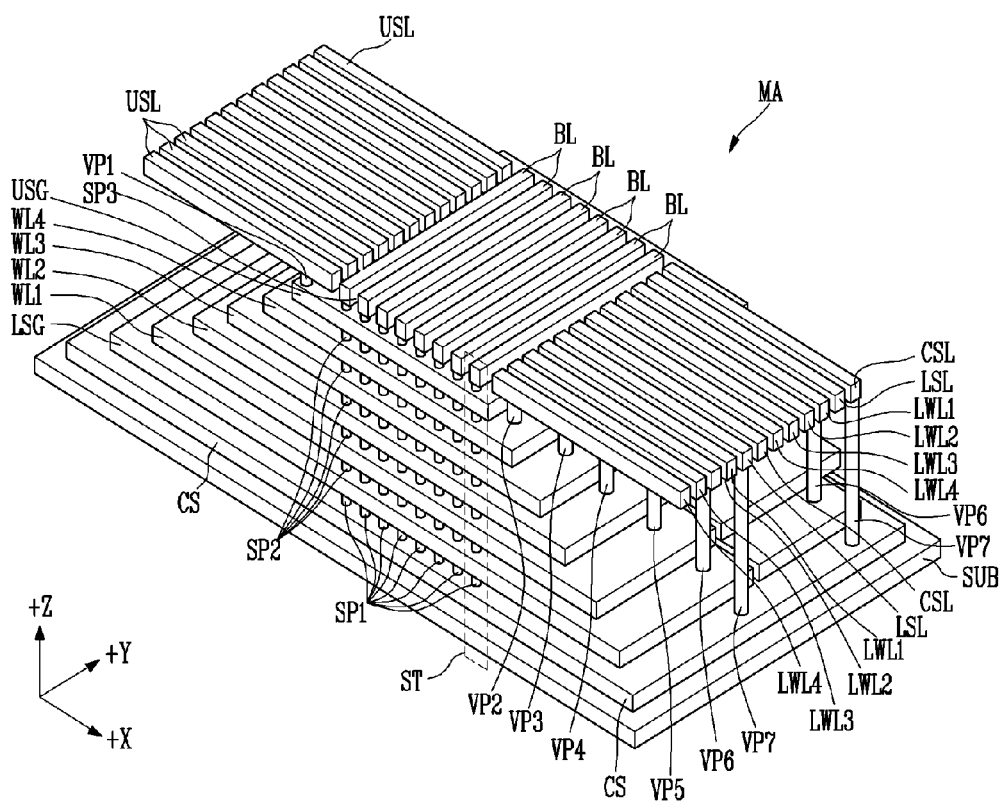
FIG. 2 is a perspective view of the flash memory array having the BiCS structure shown in FIG. 1.
Figure 3:
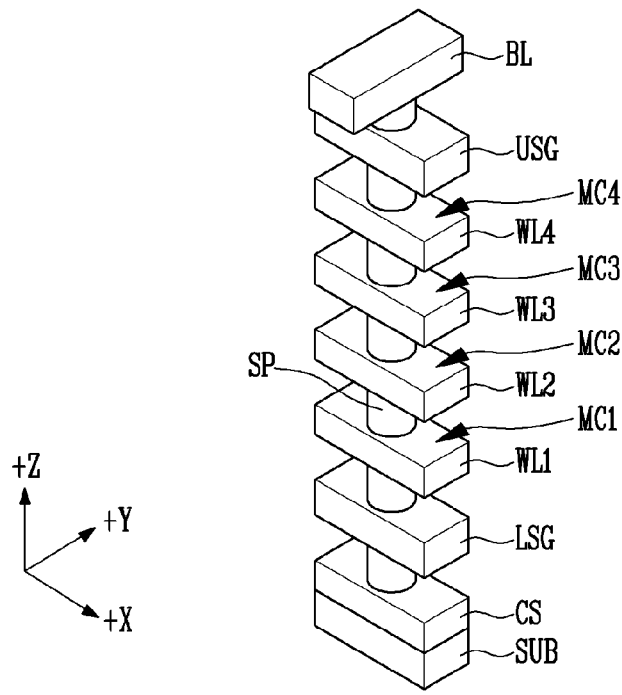
FIG. 3 is a perspective view of a memory string shown in FIG. 2.

FIG. 2 is a perspective view of the flash memory array having the BiCS structure shown in FIG. 1, and FIG. 3 is a perspective view of the memory string shown in FIG. 2. In FIGS. 2 and 3, in order to clearly show the structure of the memory array, insulating layers are not shown, but only conductive layers are shown.

Figure 4A:
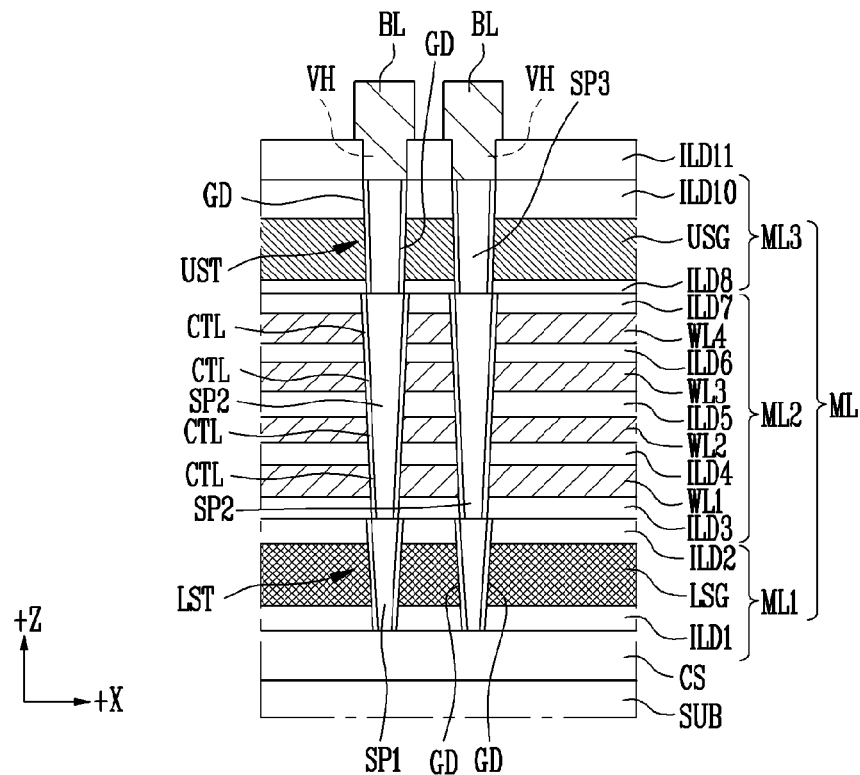
FIG. 4A is a partial cross-sectional view of the memory array taken along X-axis and Z-axis directions of FIG. 2.
Figure 4B:
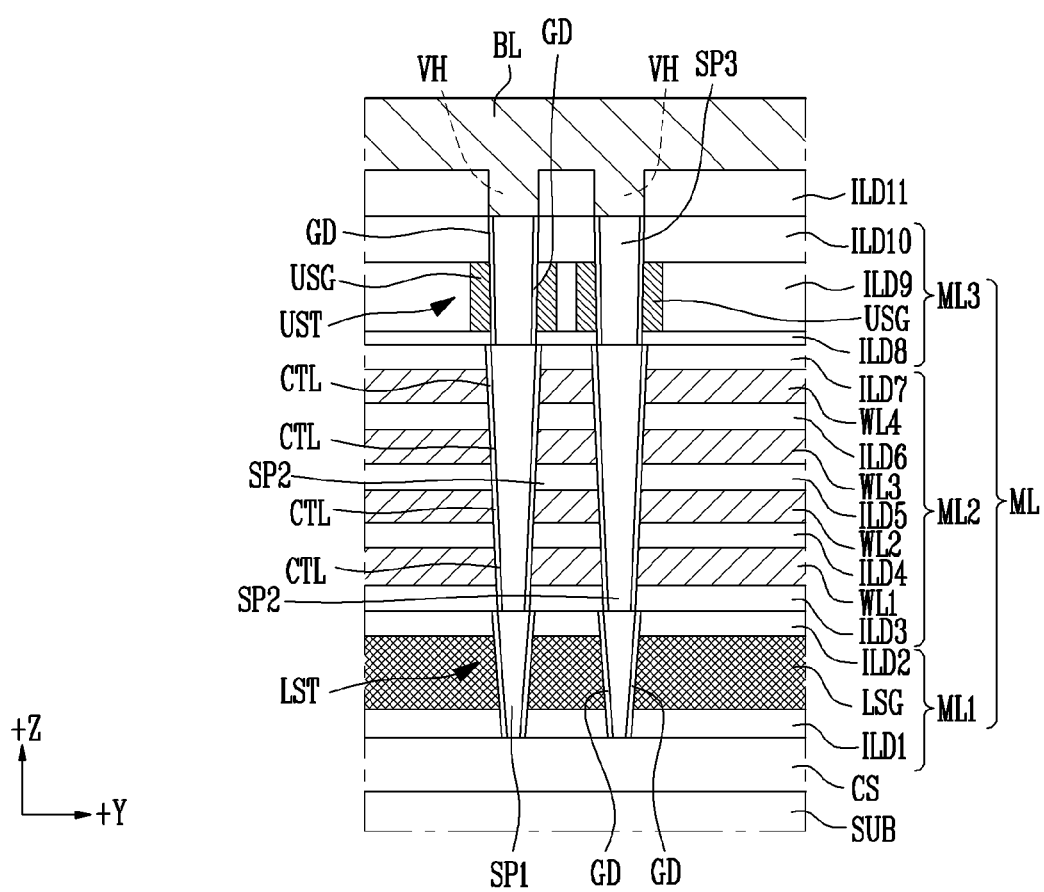
FIG. 4B is a partial cross-sectional view of the memory array taken along Y-axis and Z-axis directions of FIG. 2.

FIG. 4A is a partial cross-sectional view of the memory array taken along X-axis and Z-axis directions of FIG. 2, and FIG. 4B is a partial cross-sectional view of the memory array taken along Y-axis and Z-axis directions of FIG. 2. That is, FIG. 4A is a cross-sectional view of the memory array of FIG. 2 taken along a direction crossing the bit lines. FIG. 4B is a cross-sectional view of the memory array of FIG. 2 taken along the direction of the bit lines. In order to show the structure of the memory array simply and clearly, only two adjacent memory strings are shown in FIGS. 4A and 4B.

Referring to FIGS. 2, 3, 4A, and 4B, the common source CS is formed on the silicon substrate SUB. For example, the common source CS may be a silicon layer doped with impurities of a high concentration in order to lower resistance. Furthermore, the common source CS is formed in every memory block.

A first insulating layer ILD1 is formed on the common source CS. A low select gate LSG is formed on the first insulating layer ILD1, and a second insulating layer ILD2 is formed on the low select gate LSG. The lower select gate LSG may be formed of a silicon, and the first and the second insulating layers ILD1 and ILD2 may be formed of a silicon oxide. Here, the second insulating layer ILD2 may be omitted. A first hole is formed in the second insulating layer ILD2, the lower select gate LSG, and the first insulating layer ILD1. A first vertical channel layer SP1 is formed in the first hole and coupled to the common source CS. The first vertical channel layer SP1 may be formed of a silicon. Furthermore, a gate insulating layer GD is formed between the first vertical channel layer SP1 and the lower select gate LSG. The number of first vertical channel layers SP1 or the number of lower select transistors LST is determined according to the number of memory strings ST included in the memory block.

Accordingly, the lower select transistors LST are formed of the lower select gate LSG, the gate insulating layer GD, and the first vertical channel layer SP1.

Insulating layers ILD3 to ILD7 and conductive layers WL1 to WL4 are alternately stacked over an underlying structure ML1 including the lower select transistors LST. The insulating layers are formed on and under the conductive layer in order to isolate the conductive layers WL1 to WL4 from each other. The insulating layers ILD3 to ILD7 may be formed of a silicon oxide. The conductive layers WL1 to WL4 may be formed of an amorphous silicon or a polysilicon in order to form the word lines. The number of conductive layers WL1 to WL4 may vary according to a process condition or design. It is to be noted that only the four conductive layers WL1 to WL4 are shown, for convenience of description. The number of memory cells coupled in series in the memory string ST is determined according to the number of stacked conductive layers. Furthermore, the conductive layers WL1 to WL2 for the word lines are formed in a sheet form within the memory block because the control gates (or the word lines) of the memory cells are coupled to each other within a memory block.

A second hole is formed in the insulating layers ILD3 to ILD7 and the conductive layers WL1 to WL4. A charge trap stack layer CTL is formed on the inner wall of the second hole. Here, the charge trap stack layer CTL may include a first dielectric layer, a second dielectric layer, and a charge trap layer formed between the first and the second dielectric layers. A second vertical channel layer SP2 for the channels of the memory cells coupled to the first vertical channel layer SP1 is formed in the second hole through the insulating layers ILD3 to ILD7 and the conductive layers WL1 to WL4. Accordingly, the memory cells MC1 to MC4 are formed at respective portions where the conductive layers WL1 to WL4 surround the second vertical channel layers SP2.

In addition, the first dielectric layer is formed on the sidewalls of the insulating layers ILD3 to ILD7 and the conductive layers WL1 to WL4 which are exposed to the inner wall of the second hole. The first dielectric layer may be formed of an insulating material having a higher dielectric constant than the silicon oxide layer formed of the silicon oxide. The charge trap layer functions to trap electrons injected from the second vertical channel layer SP2 via the second dielectric layer. The charge trap layer may be formed of a nitride. The second dielectric layer may be formed of a silicon oxide between the charge trap layer and the second vertical channel layer SP2.

If the conductive layers WL1 to WL4 are stacked to have the same pattern, the conductive layers cannot be coupled to respective wires. Therefore, the conductive layers WL1 to WL4 are stacked in a direction crossing the bit lines so that the lengths of the conductive layers WL1 to WL4 decrease gradually. In other words, an upper conductive layer (for example, WL2) has a length shorter than a lower conductive layer (for example, WL1), and arranged at an upper central portion of the lower conductive layer (for example, WL1). Thus, the end of the lower conductive layer (for example, WL1) not overlapping with the upper conductive layer (for example, WL2) is coupled to a metal wire (or a local word line LWL2) through via plugs (for example, VP4). The wire connection structure is described in more detail below.

An eighth insulating layer ILD8 is formed on an underlying structure ML2 including the memory cells MC1 to MC4 vertically formed. A stepped structure is formed when the lengths of the conductive layers WL1 to WL4 formed under the eighth insulating layer ILD8 decrease, i.e. when a length of an upper conductive layer is shorter than a length of a lower conductive layer. The eighth insulating layer ILD8 is formed thickly to compensate for the stepped structure. A polishing process may be performed on the eighth insulating layer ILD8 so that the top surface of the entire structure become flat.

A ninth insulating layer ILD9 is formed on the eighth insulating layer ILD8. A plurality of trenches, each having a greater width than the second vertical channel layer SP2, is formed in the ninth insulating layer ILD9. The trenches are formed in directions crossing the bit lines, and each of the trenches has a shorter length than the conductive layer WL4.

An upper select gate USG is formed in each of the trenches, and a tenth insulating layer ILD10 is formed on the upper select gates USG. Since the upper select gates USG are formed in the trenches, the upper select gates USG are formed in the direction crossing the bit lines and are formed to have a shorter length than the conductive layer WL4. The upper select gates USG may be formed of a silicon, and the eighth to tenth insulating layers ILD8 to ILD10 may be formed of a silicon oxide. Here, the tenth insulating layer ILD10 may be omitted.

A third hole is formed in the tenth insulating layer ILD10, the upper select gate USG, and the eighth insulating layer ILD8. A third vertical channel layer SP3 coupled to the second vertical channel layer SP2 is formed in the third hole. The third vertical channel layer SP3 may be formed of a silicon. Furthermore, a gate insulating layer GD is formed between the third vertical channel layer SP3 and the upper select gate USG. Accordingly, the upper select transistors UST are formed of the upper select gate USG, the gate insulating layer GD, and the third vertical channel layer SP3.

Next, slits for dividing the low select gate LSG and the conductive layers WL1 to WL4 and the insulating layers ILD1 to ILD10 per memory block is formed by etching the low select gate LSG and the conductive layers WL1 to WL4 and the insulating layers ILD1 to ILD10 in the direction crossing the bit lines. An eleventh insulating layer ILD11 is formed to fill the slits, and a polishing process is then performed.

After the entire surface is polished by the eleventh insulating layer ILD11, first wire structures VP2 to VP6 and LWL4 to LWL1 and LSL coupled to the conductive layers WL1 to WL4 and the lower select gate LSG, a second wire structure VP7 and CSL coupled to the common source CS, third wire structures VP1 and USL coupled to the upper select gate USG, and fourth wire structures BL coupled to the vertical channel layers SP3 are formed.

More particularly, via holes VH through which some regions of the conductive layers WL1 to WL4, the lower select gate LSG, the common source CS, the upper select gates USG, and the vertical channel layers SP3 are exposed are formed in the eleventh insulating layer ILD11. The first via plugs VP2 to VP6 respectively coupled to the conductive layers WL1 to WL4 and the lower select gate LSG, the second via plug VP7 coupled to the common source CS, and the third via plugs VP1 respectively coupled to the upper select gates USG are formed in the via holes VH.

Next, a conductive layer is formed on the eleventh insulating layer ILD11 including the via plugs VP1 to VP7 and then patterned. Thus, the first wires LWL4 to LWL1 and LSL respectively coupled to the first via plugs VP2 to VP6, the second wire CSL coupled to the second via plug VP7, the third wires USL respectively coupled to the third via plugs VP1, and the fourth wire structures BL coupled to the vertical channel layers SP3 are formed.

The via plugs and the wires have been illustrated to be formed by different processes. However, the via plugs and the wires may be formed at the same time by forming a conductive layer for the wires to fill the via holes VH and then patterning the conductive layer.

The first wires LWL4 to LWL1 and LSL respectively coupled to the conductive layers WL1 to WL4 and the lower select gate LSG through the first via plugs VP2 to VP6 are formed, according to an example, in parallel in a first direction. The second wire CSL coupled to the common source CS through the second via plug VP7 is formed in the first direction along with the first wires LWL4 to LWL1 and LSL. The third wires USL coupled to the respective upper select gates USG through the third via plugs VP1 are formed in parallel in the first direction. The fourth wire structures BL coupled to the vertical channel layers SP3 are formed, according to an example, in parallel in a second direction crossing the first direction. In particular, the first and the second wires LWL4 to LWL1, LSL, and CSL are formed on one side of the fourth wire structures BL. The third wires USL are formed on the other side of the fourth wire structures BL and are extended in opposite directions.

When the conductive layers CS, LSG, WL1 to WL4, and USG and the insulating layers GD and ILD1 to ILD10 are formed as described above, the memory array MA of a 3-D structure, including the plurality of vertical memory strings ST including the vertical channel layers, is formed.

In addition, the conductive layers LSG and WL1 to WL4 and the insulating layers ILD1 to IDL7 formed in the peripheral region are removed during the process of patterning the stepped conductive layers LSG and WL1 to WL4 or the etching process for forming the slits. Furthermore, processes of fabricating components of the semiconductor device, such as transistors, are performed in the peripheral region. However, a stepped structure is formed because the memory string ST is formed to have a vertical structure. This makes it difficult to perform the manufacturing processes in the peripheral region.

FIGS. 5A to 5I are diagrams illustrating a method of manufacturing a semiconductor memory device according to an embodiment of the present invention.

Figure 5A:
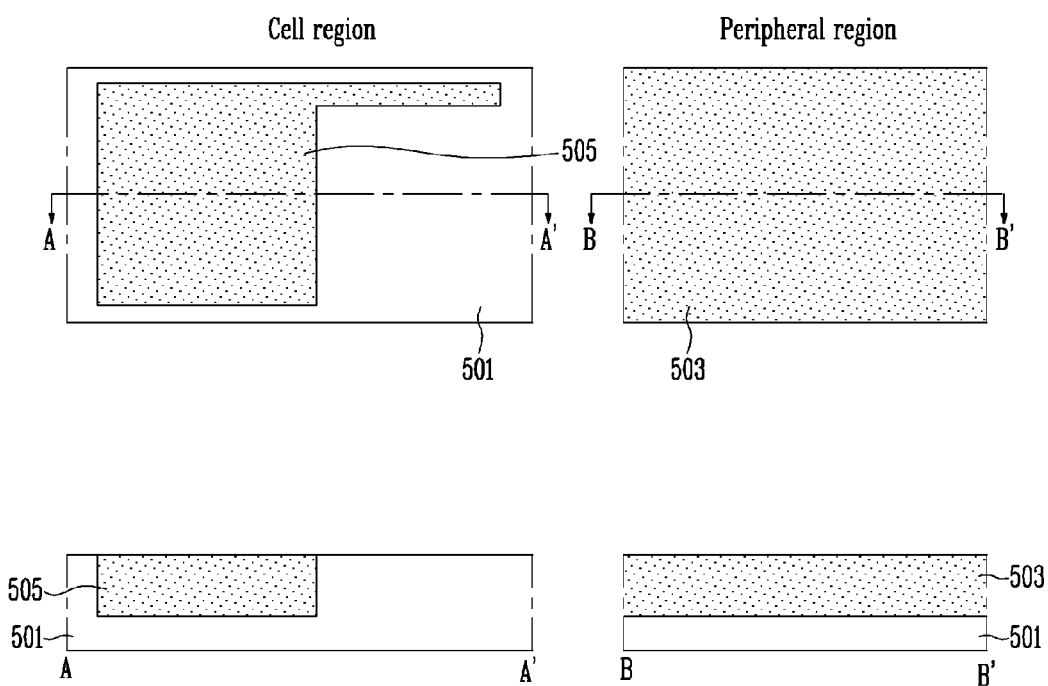
FIGS. 5A to 5I are diagrams illustrating a method of manufacturing a semiconductor memory device according to an embodiment of the present invention.

Referring to FIG. 5A, a well 503 is formed in the peripheral region of a semiconductor substrate 501. Furthermore, a common source 505 is formed in the cell region of the semiconductor substrate 501. The common source 505 is formed in the semiconductor substrate 501 by means of an ion implantation process. The common source 505 may be formed by implanting 5-valence impurities (that is, N type impurities). Phosphorous (P) or arsenic (As) may be used as the 5-valence impurities. Also, the common source 505 is formed in each region where a memory block is to be formed in the cell region.

Figure 5B:
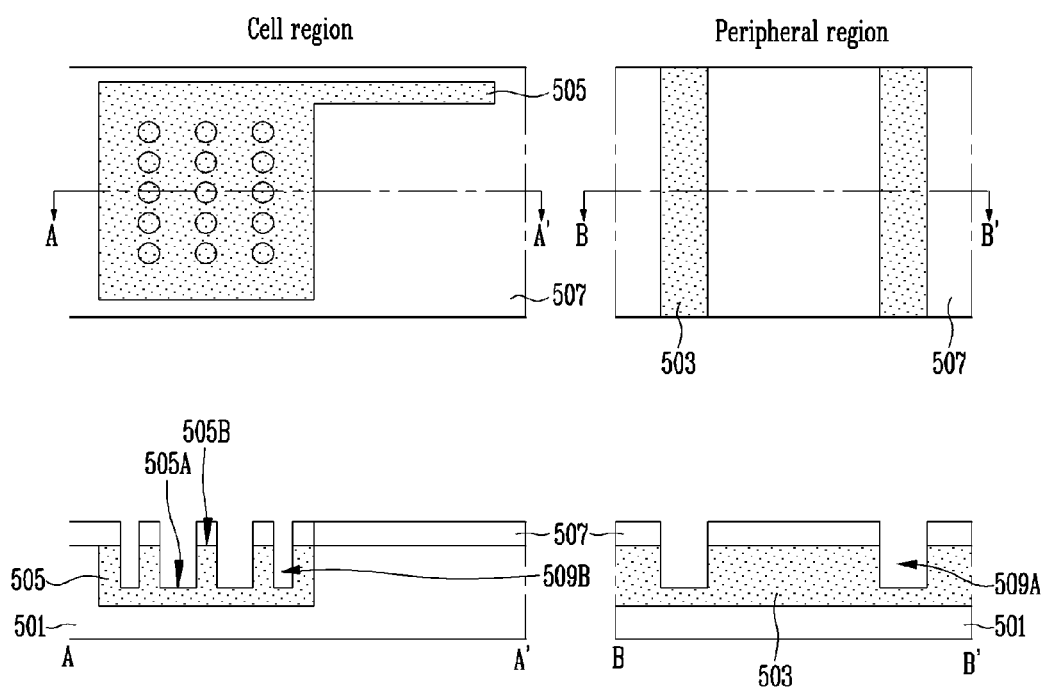

Referring to FIG. 5B, a hard mask 507 is formed on the semiconductor substrate 501. The hard mask 507 includes a first opening part through which a region where concave (凹) surfaces 505A are formed is exposed in the common source 505 of the cell region and a second opening part through which an isolation region is exposed in the peripheral region. The semiconductor substrate 501 is etched by an etching process using the hard mask 507 as an etch mask. Thus, trenches 509A for isolation are formed in the isolation region of the peripheral region, and trenches 509B are formed in the common source 505 of the cell region.

When the trenches 509B are formed in the common source 505, the bottom surfaces of the trenches 509B become the concave surfaces 505A, and the top surfaces of the common source 505 where the trenches 509B are not formed become the convex (凸) surfaces 505B. In a subsequent process, a conductive layer for forming a lower select gate is formed. The regions of the common source 505 where the trenches 509B are formed correspond to regions where the lower select gate is to be formed. Furthermore, the convex surfaces 505B of the common source 505, surrounded by the trenches 509B, correspond to regions where vertical conductive layers for vertical channel layers are formed in a subsequent process. That is, the convex surfaces 505B of the common source 505 become regions where vertical memory strings are formed.

In the common source 505, the trenches 509B may be formed so that the convex surfaces 505B are arranged in a regular matrix form lengthwise and widthwise. In this case, the trenches 509B may be divided into first trenches arranged in parallel in the direction of the length and second trenches arranged in parallel in the direction of the width. The number of convex surfaces 509B corresponds to the number of memory strings formed in a memory block. Thus, shapes of the trenches 509B may be determined according to the number of convex surfaces 509B or the number of memory strings.

Because the common sources 505 of the memory strings formed in the same memory block are coupled to each other, the trenches 509B of the common source 505 may be formed to have a shallower depth than the common source 505. In this case, although the trenches 509B are formed, the common sources 505 are coupled without being disconnected under the trenches 509B.

The depth of the trenches 509B in the cell region may differ from the depth of the trenches 509A in the peripheral region. If the depths are different from each other, the trenches 509B of the cell region and the trenches 509A of the peripheral region may be formed by different etching processes.

Figure 5C:
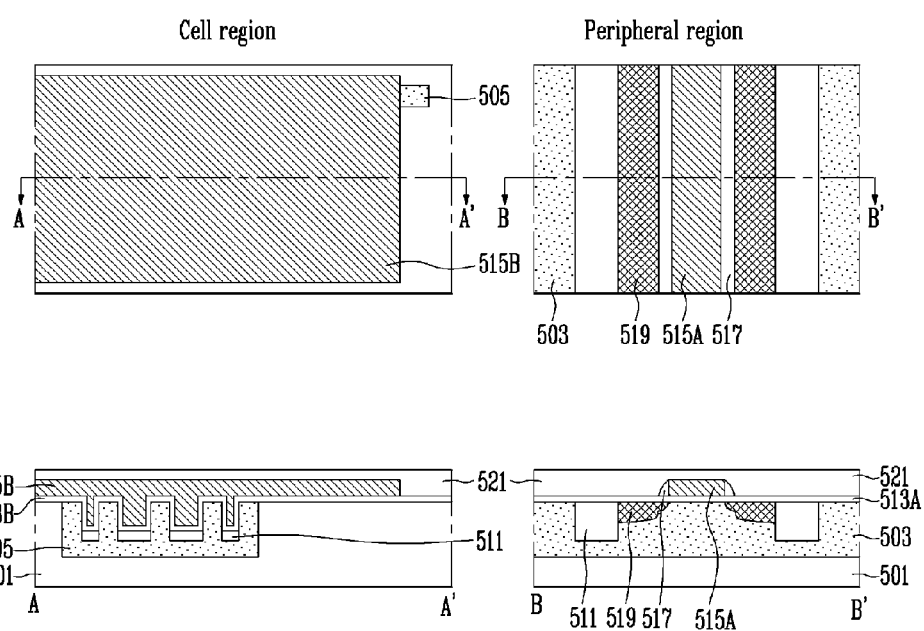

Referring to FIG. 5C, insulating layers 511 for isolation are formed in the respective trenches 509A of the peripheral region. The insulating layers 511 for isolation may also be formed in the respective trenches 509B of the cell region. In this case, insulating layers for isolation, formed in the trenches 509B of the cell region, are removed. A lower select gate 515B is formed in the trenches 509B of the cell region. In order to isolate the lower select gate 515B from the concave surfaces of the common source 505, the insulating layers 511 for isolation may remain at the bottoms of the trenches 509B. To this end, an etching process for removing a portion of the insulating layers 511 formed in the trenches 509B may be additionally performed.

Next, insulating layers 513A and 513B are formed on a surface of the peripheral region of the semiconductor substrate 501 and on a surface of the cell region including the trenches 509B. The insulating layer 513A formed in the peripheral region is used as a gate insulating layer of a transistor, and the insulating layer 513B formed in the cell region is used as a gate insulating layer of a lower select transistor included in memory strings.

A conductive layer is formed on the entire surface of the semiconductor substrate 501 so that the trenches 509B of the cell region where the insulating layer 513B is formed are filled and then patterned. Accordingly, the lower select gate 515B is formed in the cell region, and the gate 515A of the transistor is formed in the peripheral region. Here, the lower select gate 515B is formed to cover the entire common source 505 other than portions to which via plugs will be coupled. Furthermore, the lower select gate 515B may be formed only in the trenches 509B. The first conductive layer for the lower select gate 515B may be formed of polysilicon.

In the peripheral region, insulating layer spacers 517 are formed on the sidewalls of the gate 515A, and impurity regions 519 to be used as a source and a drain are formed. Accordingly, the transistor is formed.

After the process of manufacturing is completed in the peripheral region, an insulating layer 521 is formed on the entire structure including the lower select gate 515B, and a polishing process is then performed. Here, the insulating layer 521 may be omitted because an insulating layer is also formed in a subsequent process.

Figure 5D:
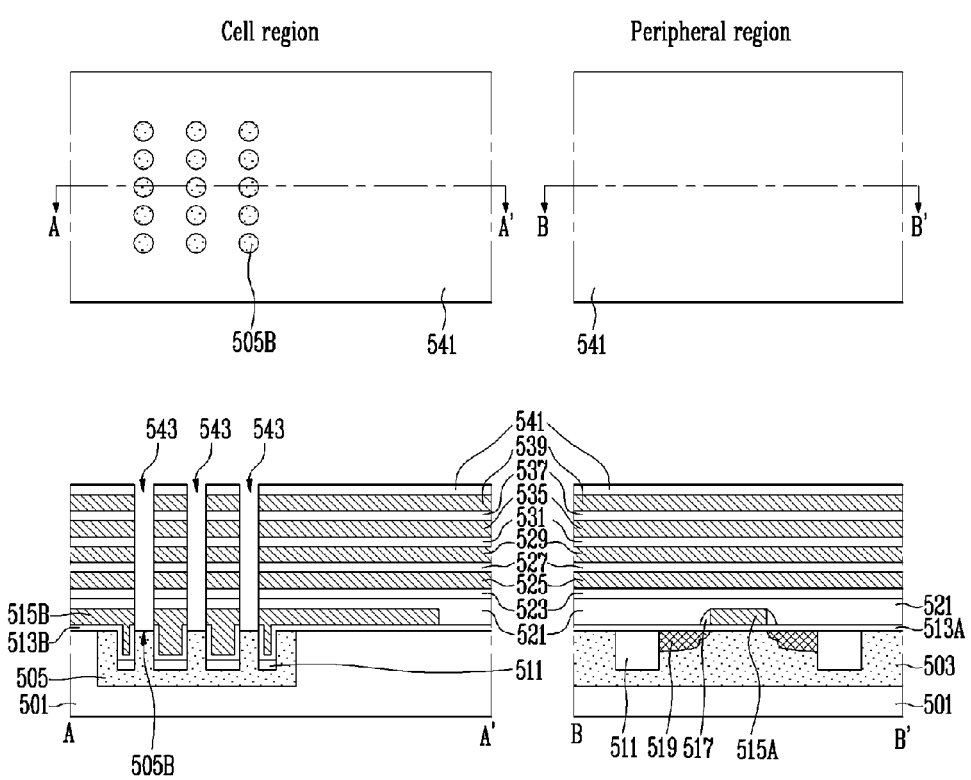

Referring to FIG. 5D, insulating layers 523, 527, 531, 537, and 541 and second conductive layers 525, 529, 535, and 539 are alternately stacked over the semiconductor substrate 501 in which the lower select gates 515B are formed. The insulating layers 523, 527, 531, 537, and 541 are formed on and under the conductive layers 525, 529, 535, and 539 in order to isolate the second conductive layers 525, 529, 535, and 539 from each other. The insulating layers 523, 527, 531, 537, and 541 may be formed of silicon oxide. The second conductive layers 525, 529, 535, and 539 may be formed of amorphous silicon or polysilicon and may be used as word lines. The number of second conductive layers 525, 529, 535, and 539 may vary according to a process condition or design, but only the 4 conductive layers are shown in the drawing, for convenience of description. The number of memory cells coupled in series in the memory string is determined according to the number of stacked conductive layers. Furthermore, since the control gates of the memory cells or the word lines are coupled to each other within a memory block, each of the conductive layers WL1 to WL4 for the word lines is formed in a sheet form within the memory block.

Holes 543 through which the convex surfaces 505B of the common source 505 are exposed are formed in the insulating layers 513B, 523, 527, 531, 537, and 541 and the conductive layers 525, 529, 535, and 539. If the lower select gate 515B is formed on the convex surfaces 505B of the common source 505, the holes 543 are formed in the lower select gate 515B in order to expose the convex surfaces 505B of the common source 505. That is, the holes 543 are formed to penetrate the insulating layers 513B, 523, 527, 531, 537, and 541, the conductive layers 525, 529, 535, and 539, and the lower select gates 515B.

Figure 5E:
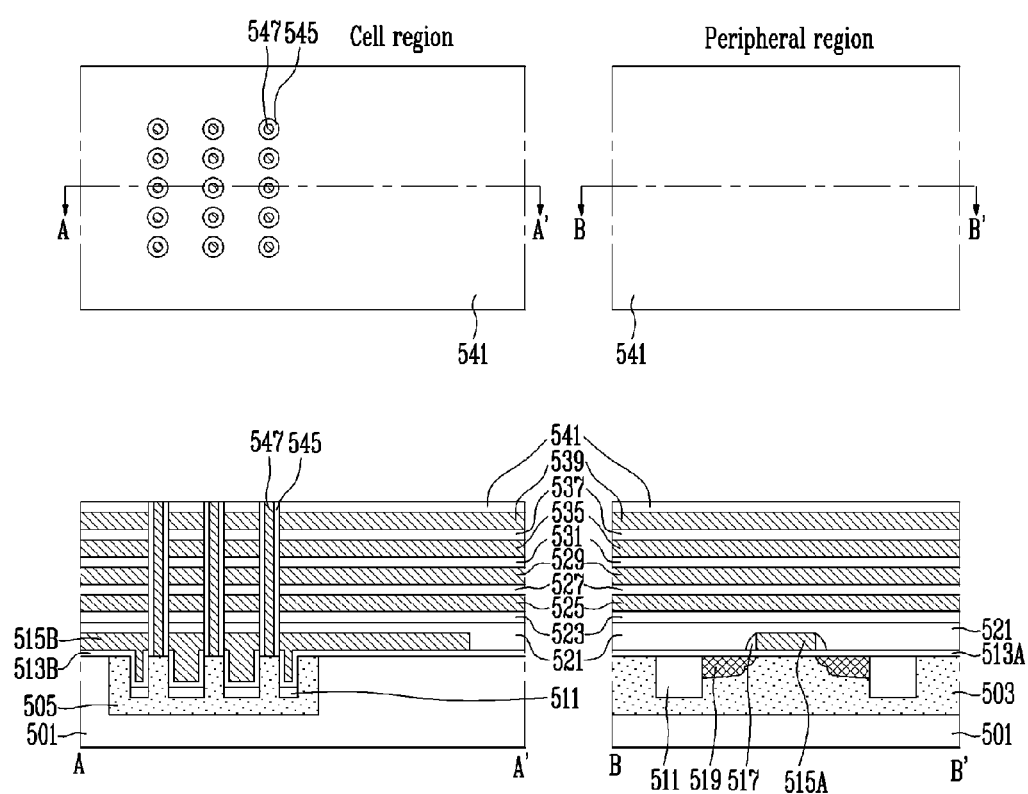

Referring to FIG. 5E, a charge trap stack layer 545, including a first dielectric layer, a charge trap layer, and a second dielectric layer, is formed on the inner wall of each hole 543. The charge trap layer is formed between the first and the second dielectric layers. Vertical conductive layers 547 are formed within the respective holes 543 in which the charge trap stack layers 545 are formed and are coupled to the respective convex surfaces 505B of the common source 505 through the insulating layers 513B, 523, 527, 531, 537, and 541 and the conductive layers 525, 529, 535, and 539.

The vertical conductive layers 547 are used as the vertical channels of the memory cells. Accordingly, the lower select transistors are formed at respective portions where the lower select gates 515B surround the vertical conductive layers 547, and the memory cells are formed at respective portions where the conductive layers 525, 529, 535, and 539 surround the vertical conductive layers 547.

Here, the first dielectric layer is formed on the sidewalls of the insulating layers 523, 527, 531, 537, and 541 and the conductive layers 525, 529, 535, and 539 which are exposed to the inner walls of the holes. The first dielectric layer may be formed of the silicon oxide or an insulating material having a higher dielectric constant than the silicon oxide. The charge trap layer functions to trap electrons injected from the vertical conductive layer 547 via the second dielectric layer. The charge trap layer may be formed of a nitride. The second dielectric layer may be formed of a silicon oxide between the charge trap layer and the vertical conductive layer 547.

Figure 5F:
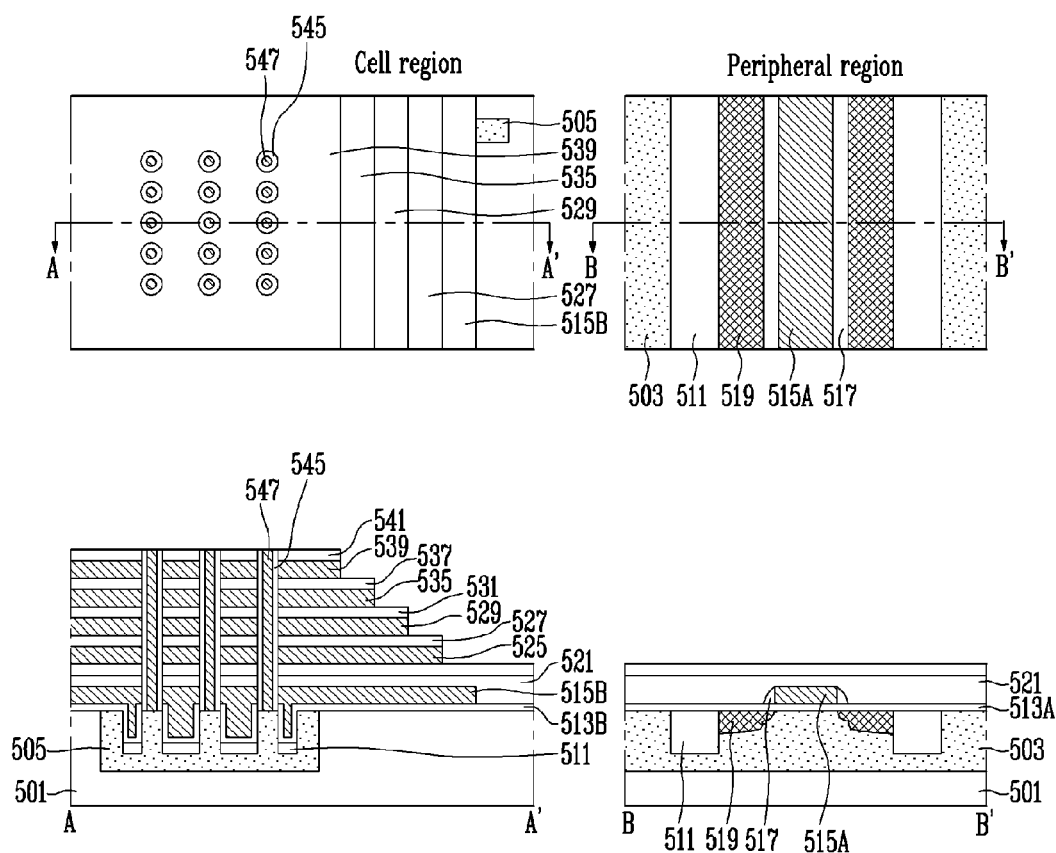

Referring to FIG. 5F, the conductive layers 525, 529, 535, and 539 and the insulating layers 523, 527, 531, 537, and 541 are etched so that the ends of the conductive layers 525, 529, 535, and 539 have step shapes. Here, the conductive layers 525, 529, 535, and 539 are etched to have gradually shorter lengths in the direction crossing the bit lines. That is, an upper conductive layer (for example, 539) has a shorter length than a lower conductive layer (for example, 535), and formed over the central portion of the lower conductive layer (for example, 535). Accordingly, the end of the lower conductive layer (for example, 535) at a portion not overlapping with the upper conductive layer (for example, 539) is coupled to via plugs formed in a subsequent process.

When stepped structure is formed at the end portion of the conductive layers 525, 529, 535, and 539 and the insulating layers 523, 527, 531, 537, and 541 in the cell region by performing an etching process, the conductive layers 525, 529, 535, and 539 and the insulating layers 527, 531, 537, and 541 in the peripheral region are removed.

Figure 5G:
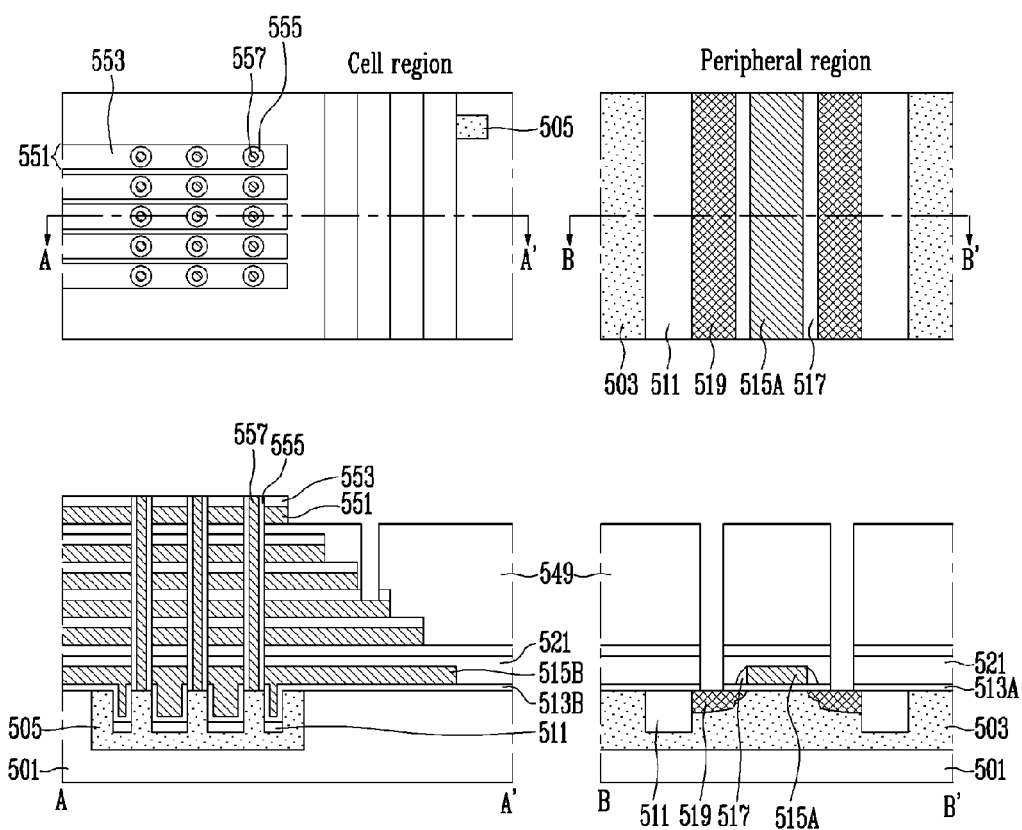

Referring to FIG. 5G, an insulating layer 549 for planarization is formed on the entire structure including underlying structures, such as the memory cells vertically formed by the vertical conductive layer 547, the charge trap stack layer 545, and the conductive layers 525, 529, 535, and 539. Here, the insulating layer 549 is formed thickly in order to compensate for the stepped structure of the cell region and a difference of thickness between the cell region and peripheral region, and then a polishing process may be performed in order to make flat the entire structure.

Next, a third conductive layer 551 and an insulating layer 553 are formed on the entire structure. After the third conductive layer 551 and the insulating layer 553 are formed, a patterning process is performed to form upper select gates 551 over the insulating layer 549 of the cell region. The upper select gates 551 are formed in parallel in the direction crossing the bit lines and are formed to have a shorter length than the highest conductive layer 539 of the conductive layers 525, 529, 535, and 539 for the word lines. The upper select gates 551 may be formed of silicon.

Via holes through which the respective vertical conductive layers 547 are exposed through the upper select gates 551 and the insulating layers 553 and 549. A gate insulating layer 555 is formed on the sidewalls of the via holes. Next, a conductive layer 557 is formed to fill each of the via holes in which the gate insulating layers 555 are formed. The conductive layers 557 are coupled to the respective vertical conductive layers 547 and are used as a part of the vertical channel layers. Accordingly, the upper select transistors, including the upper select gates 551, the gate insulating layer 555, and the conductive layers 557, are formed.

Figure 5H:
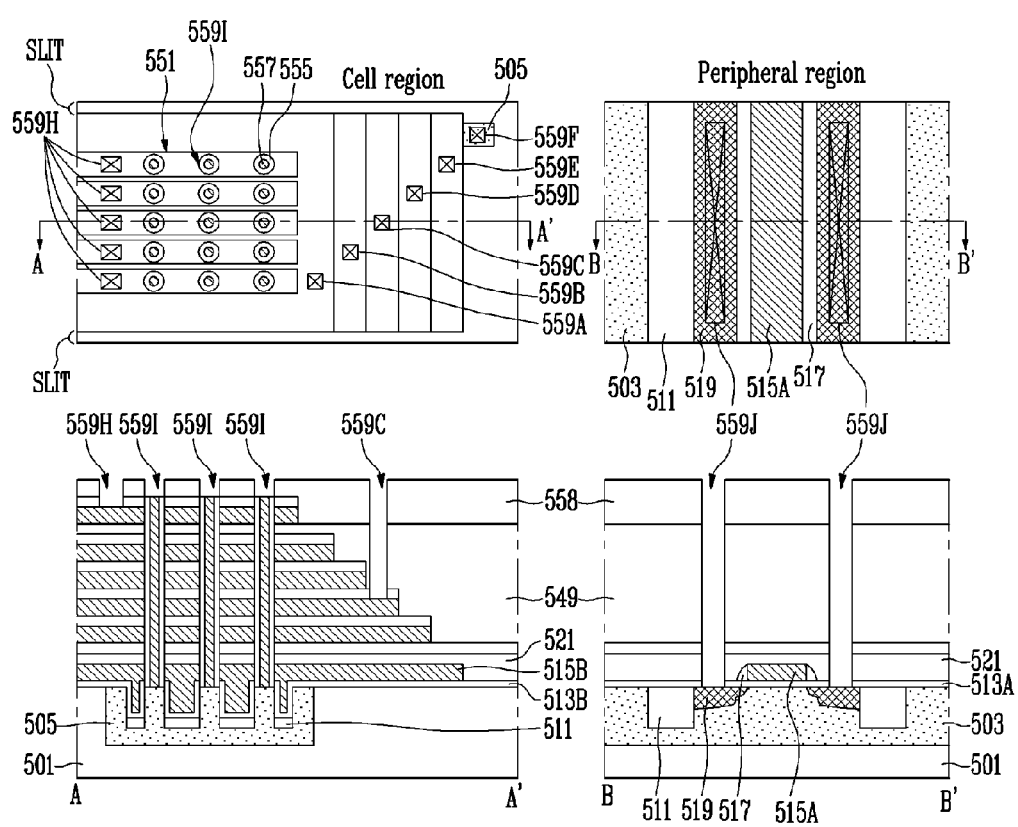

Referring to FIG. 5H, slits SLIT for dividing the conductive layers 515B, 525, 529, 535, and 539 and the insulating layers 521, 523, 527, 531, 537, and 541 are formed by etching the conductive layers 515B, 525, 529, 535, and 539 and the insulating layers 521, 523, 527, 531, 537, and 541 in the direction crossing the bit lines. Next, an insulating layer 558 is formed to fill the slits SLIT, and thus the entire structure is divided into a plurality of memory blocks. In addition, after an insulating layer 558 is formed, a polishing process is performed.

Via holes 559A to 559I are formed through which some regions of the conductive layers 525, 529, 535, and 539, the lower select gate 515B, the common source CS, the upper select gates 551, and the vertical channel layers 557 are exposed at positions where the conductive layers 525, 529, 535, and 539, the lower select gate 515B, the common source CS, the upper select gates 551, and the vertical channel layers 557 do not overlap with each other. Here, via holes 559J through which the impurity regions 519 corresponding to the source and drain of the transistor are exposed are also formed in the peripheral region.

Figure 5I:
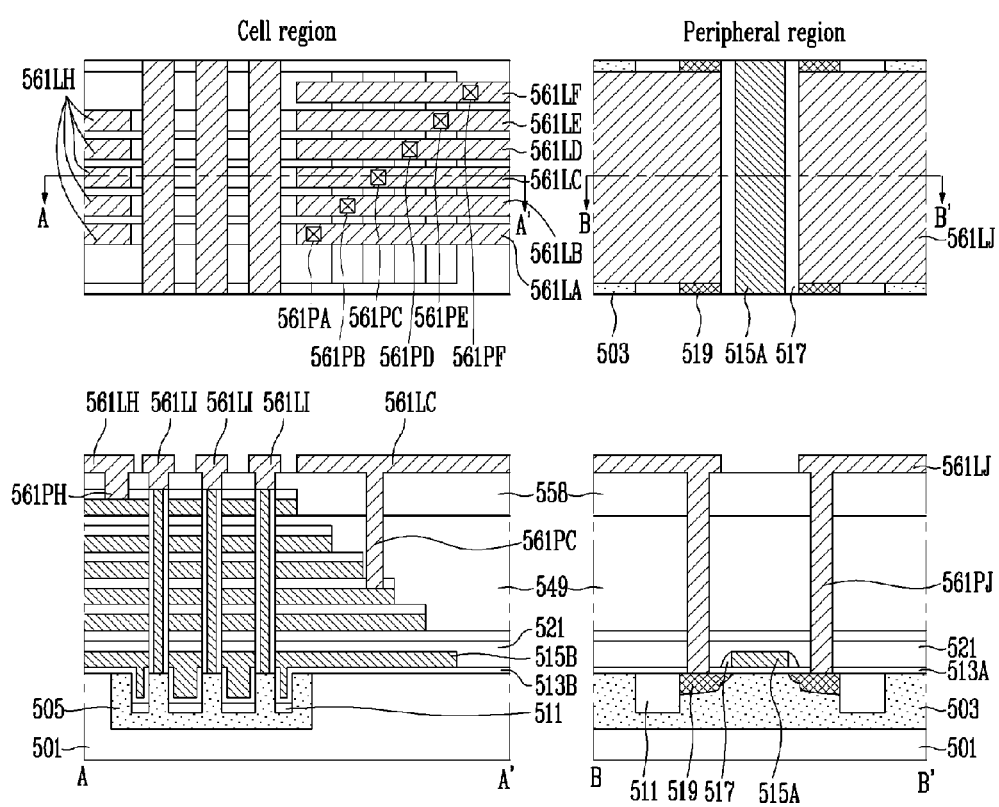

Referring to FIG. 5I, first via plugs 561PA to 561PE respectively coupled to the conductive layers 525, 529, 535, and 539 and the lower select gate 515B, a second via plug 561PF coupled to the common source 505, and third via plugs 561PH coupled to the respective upper select gates 551 are formed within the via holes 559A to 559J. Here, via plugs 561PJ coupled to the impurity regions 519 are formed within the respective via holes 559J in the peripheral region.

Next, a conductive layer is formed on the insulating layer 558 including the via plugs 561PA to 561P3 and then patterned. Thus, first wires 561LA to 561LE for local word lines and a lower select line respectively coupled to the first via plugs 561PA to 561PE, a second wire 561LF for a common source line coupled to the second via plug 561PF, third wires 561LH for upper select lines respectively coupled to the third via plugs 561PH, and fourth wire structures 561LI for bit lines, coupled to the respective conductive layers 557 and used as part of the vertical channel layers, are formed. Furthermore, wires 561LJ coupled to the respective via plugs 561PJ are formed in the peripheral region.

Although an example where the via plugs and the wires are formed by different processes has been described above, the via plugs and the wires may be formed at the same time by forming the conductive layer for the wires to fill the via holes and then patterning the conductive layer.

The first wires 561LA to 561LE, respectively coupled to the conductive layers 525, 529, 535, and 539 and the lower select gate 515B through the first via plugs 561PA to 561PE, are formed in parallel in the first direction. The second wire 561LF coupled to the common source 505 through the second via plug 561PF are formed in the first direction along with the first wires 561LA to 561LE. The third wires 561LH coupled to the respective upper select gates 551 through the third via plugs 561PH are formed in parallel in the first direction. The fourth wire structures 561LI coupled to the vertical channel layers 557 are formed in parallel in the second direction crossing the first direction. In particular, the first to second wires 561LA to 561LF are formed on one side of the fourth wire structures 561LI. The third wires 561LH are formed on the other side of the fourth wire structures 561LI and extended in opposite directions.

When the conductive layers 515B, 525, 529, 535, and 539 and the insulating layers 521, 523, 527, 531, 537, and 541 are formed as described above, 3-D structured memory strings including the vertical channel layers are formed.

In the above structure, if the lower select gates 515B are formed only in the trenches 509B of the common source 505, a difference of the thickness between the cell region and the peripheral region can be reduced by the thickness of the lower select gate 515B. Furthermore, when the processes of forming components of the semiconductor device, such as transistors, in the peripheral region are performed while forming the lower select gates 515B in the cell region, the processes of forming components of the semiconductor device in the peripheral region can be easily performed without uneven height between the cell region and the peripheral region. In particular, since the manufacturing processes in the cell region and the peripheral region are performed at the same time, the number of process steps can be reduced as compared with a case where the manufacturing processes are separately performed in the peripheral region.

In the above structure, the lower select transistors are formed in the semiconductor substrate 501. Furthermore, the memory cells are stacked over the semiconductor substrate 501 including the lower select transistors, and each of the upper select transistors is formed over the memory cells. Here, the lower select transistor includes the channel region, corresponding to the concave parts of the common source 505, and the lower select gate 515B. Also, the lower select transistor is surrounded by the common source 505. The lower select gate 515B of the lower select transistor is formed within the trench of the common source 505 and over the substrate 501. In this case, the charge trap stack layer 555 is extended to an area between the gate 515B of the lower select transistor and the vertical channel layer 557.

In a known art, the channel regions of the lower select transistors are made of polysilicon on the semiconductor substrate. In an embodiment of the present invention, however, the lower select transistors are formed within the semiconductor substrate 501 or the common source 505, and a part (for example, protrusions) of the common source 505 defined by the trenches becomes the channel regions of the lower select transistors. Accordingly, as an N type silicon channel is used in the lower select transistor, an on/off characteristic can be improved.

As described above, in an embodiment of the present invention, a difference of the thickness between the cell region and the peripheral region can be reduced by forming the underlying structures of the memory array within the semiconductor substrate. Transistors can be easily formed in the peripheral region, the number of process steps can be reduced, and manufacturing processes can be simplified by performing processes of forming the memory array in the cell region and processes of forming the transistors in the peripheral region at the same time.

What is claimed is:

1. A semiconductor memory device, comprising:
    a lower select transistor;
    memory cells stacked over the lower select transistor and a semiconductor substrate; and
    an upper select transistor formed over the memory cells,
    wherein at least a portion of a gate of the lower select transistor is formed in a trench of the semiconductor substrate.

2. The semiconductor memory device of claim 1, further comprising a common source formed within the semiconductor substrate to surround the lower select transistor.

3. The semiconductor memory device of claim 2, wherein at least a portion of a lower select gate of the lower select transistor is formed within each of trenches formed in the common source.

4. The semiconductor memory device of claim 3, wherein a channel region of the lower select transistor is formed in a concave part of the common source formed by the trench.

5. The semiconductor memory device of claim 4, wherein the common source is formed of an N type impurity region.

6. The semiconductor memory device of claim 3, further comprising an insulating layer formed between the lower select gate and the common source, wherein the insulating layer is thicker in a bottom of the trench than in a sidewall of the trench.

7. The semiconductor memory device of claim 3, wherein at least a portion of the lower select gate of the lower select transistor is formed over the semiconductor substrate.

8. A semiconductor memory device, comprising:
    protrusions defined by trenches of a semiconductor substrate and formed in an impurity region of the semiconductor substrate lengthwise and widthwise;
    a first conductive layer formed within the trench;
    a stacked structure in which second insulating layers and second conductive layers are alternately stacked over the first conductive layer and the impurity region;
    third conductive layers arranged on the stacked structure in parallel in a first direction; and
    vertical conductive layers coupled to the respective protrusions of the impurity region through the stacked structure and the third conductive layers.

9. The semiconductor memory device of claim 8, wherein the impurity region is formed to a deeper area than the bottom of the trench.

10. The semiconductor memory device of claim 8, wherein the trenches comprise:
    first trenches formed in the impurity region in parallel lengthwise; and
    second trenches formed in the impurity region in parallel widthwise and formed to cross the first trenches.

11. The semiconductor memory device of claim 8, further comprising:
    a first insulating layer formed between the first conductive layer and the impurity region; and
    a third insulating layer formed between the second conductive layers and the vertical conductive layers.

12. The semiconductor memory device of claim 8, further comprising a charge trap layer formed between the second conductive layers and the vertical conductive layers.

13. The semiconductor memory device of claim 8, wherein: the first conductive layer is formed over the protrusions of the impurity region, and the vertical conductive layers are coupled to the respective protrusions through a hole formed in the first conductive layer.

14. The semiconductor memory device of claim 13, further comprising a charge trap layer formed between the first conductive layer and the vertical conductive layers and between the second conductive layers and the vertical conductive layers.

15. A semiconductor memory device, comprising:
    a common source formed within a semiconductor substrate and formed to include trenches formed near a channel connection region;
    low select gates formed within the trenches of the common source;
    insulating layers and word lines alternately stacked over the common source and the lower select gate;
    upper select gates formed over a highest insulating layer of the insulating layers;
    vertical channel layers coupled to the channel connection region of the common source through holes formed in the upper select gates, the insulating layers, and the word lines; and
    charge trap layers formed between the word lines and the vertical channel layers.

16. The semiconductor memory device of claim 15, wherein the common source is formed to a deeper area than the bottom of the trench.

17. A method of manufacturing a semiconductor memory device, comprising:
    forming an impurity region within a semiconductor substrate;
    forming trenches to form concave parts and convex parts within the impurity region;
    forming a first insulating layer on an entire surface of the impurity region including the trenches;
    forming a first conductive layer in the impurity region to fill the trenches;

forming a stacked structure in which second insulating layers and second conductive layers are alternately stacked on the impurity region including the first conductive layer;

forming holes in the stacked structure exposing the convex parts of the impurity region;

forming a charge trap layer and a first vertical conductive layer within each of holes;

forming third conductive layers arranged in parallel on underlying structures including the vertical conductive layers; and forming a third insulating layer and a second vertical conductive layer within each of holes through which the vertical conductive layer is exposed through the third conductive layers.

18. The semiconductor memory device of claim 17, wherein the impurity region is formed by implanting N type impurities into the semiconductor substrate.

19. The semiconductor memory device of claim 17, wherein the trenches have a shallow depth than the impurity region.

20. The semiconductor memory device of claim 17, wherein the trenches are formed so that the convex parts of the impurity region are arranged lengthwise and widthwise.

21. The semiconductor memory device of claim 17, wherein trenches for isolation are formed in a peripheral region when the trenches are formed to form the concave parts and the convex parts within the impurity region.

22. The semiconductor memory device of claim 21, wherein an insulating layer for isolation is formed in the trenches of the peripheral region, after forming the trenches for isolation.

23. The semiconductor memory device of claim 22, wherein when the insulating layer for isolation is formed in the trenches of the peripheral region, an insulating layer for isolation is formed in the trenches of the impurity region and the insulating layer for isolation remains only at a bottom of the trenches of the impurity region.

24. The semiconductor memory device of claim 17, wherein when the first conductive layer is formed, a conductive layer for gates of transistors is formed in a peripheral region.

25. The semiconductor memory device of claim 17, wherein:

the first conductive layer is formed in the convex parts of the impurity region, and the holes formed in the stacked structure penetrate the first conductive layer formed on the convex parts.

26. The semiconductor memory device of claim 17, further comprising performing a process of forming transistors, before forming the stacked structure.

* * * * *